United States Patent [19]

Jacobs et al.

[11] Patent Number: 4,866,507
[45] Date of Patent: Sep. 12, 1989

[54] MODULE FOR PACKAGING SEMICONDUCTOR INTEGRATED CIRCUIT CHIPS ON A BASE SUBSTRATE

[75] Inventors: Scott L. Jacobs, Peekskill; Perwaiz Nihal, Hopewell Junction; Burhan Ozmat, Peekskill; Henri D. Schnurmann, Monsey; Arthur R. Zingher, White Plains, all of N.Y.

[73] Assignee: International Business Machines Corporation, Armonk, N.Y.

[21] Appl. No.: 864,228

[22] Filed: May 19, 1986

[51] Int. Cl.$^4$ ............................................. H01L 23/02
[52] U.S. Cl. ........................................ 357/74; 357/45; 357/75; 361/397; 361/412; 174/68.5
[58] Field of Search .................. 357/74, 75, 40, 45; 174/68.5; 361/397, 412

[56] References Cited

U.S. PATENT DOCUMENTS

| | | | |
|---|---|---|---|
| 4,023,197 | 5/1977 | Magdo et al. | 357/71 |
| 4,353,040 | 10/1982 | Krumm et al. | 333/1 |
| 4,458,297 | 7/1984 | Stopper et al. | 361/403 |
| 4,751,482 | 6/1988 | Fukuta et al. | 333/247 |

FOREIGN PATENT DOCUMENTS

| | | |
|---|---|---|
| 0026807 | 4/1981 | European Pat. Off. |
| 0148083 | 7/1985 | Japan |
| 2132411 | 11/1983 | United Kingdom |

OTHER PUBLICATIONS

Kazuyoshi Satoh, et al., "A High Speed Multi-Chip RAM Module with Thermal Stress Free Configuration", IEEE, 1984, pp. 569–572.

Cherensky, S., "Advanced Packaging for Ultrafast GaAs Devices", 7/5/85, pp. 1–9.

Bergendahl et al., "The Wafer Transmission Module", VLSI Systems Design Jan. 1986, pp. 54–90.

Johnson, RR., "Significance of Wafer Scale Integration in Computer Design", IEEE Proceedings of International Conference Computer Design, Oct. 1984, pp. 101–105.

Spielberger et al., "Silicon-on-Silicon Packaging", IEEE Transactions on Components, Hybrids, and Manufacturing Technology, Jun. 1984, pp. 193–196.

Landis R., "High Speed Packaging for GaAs Interconnection", 35th Electronics Components Conference, May 20, 1985, pp. 384–388.

(List continued on next page.)

Primary Examiner—Robert S. Macon
Attorney, Agent, or Firm—Aziz M. Ahsan; Steven J. Meyers

[57] ABSTRACT

An integrated circuit chip packaging structure, preferably having a semiconductor base substrate, i.e., silicon or gallium arsenide, alternating insulation and conductive layers on the base structure, at least two conductive layers being patterned into thin film wiring (i.e., thin film copper of approximately 5 microns), semiconductor integrated circuit chips connected to the upper-most patterned conductive layer, and means to connected the packaging structure to the next level of packaging (i.e., board or card).

The thin film wiring layers typically each having coplanar ground, power and signal lines, with at least one power or ground line existing between coplanar signal lines to minimize cross talk. To facilitate efficient power distribution, lines of specific power levels of the patterned planes are connected to lines of the same power level on other patterned planes to form three dimensional power planes. To reduce package capacitance and keep the RC constant low, a personalized reference plane is incorporated. The personalized plane has insulating regions extending at least partially through the plane at predetermined locations that coincide with long signal lines on the wiring layers. The combined package provides a packaging alternative that has excellent electrical performance (i.e., speed, low RC constant, efficient power distribution), high density and thermal expansion matching between the underlying semiconductor structure and semiconductor chips mounted on the package. A high yield process for manufacturing the package is also disclosed.

37 Claims, 6 Drawing Sheets

OTHER PUBLICATIONS

Chong et al., "A High Density Multichip Memory Module", Jul. 1, 1985, pp. 1-6.

Bergendahl et al., "The Wafer Transmission on Module-Wafer Scale Integration Packaging", Proceedings of the IEEE Customs Integrated Circuits Conference, Jun. 1985, pp. 55-57.

R. C. Landis, "High-Speed Packaging for GaAs Interconnection", 35th Electronic Components Conf., Washington, D.C., 20-22nd May 1985, pp. 384-388.

R. J. Jensen, et al., "Copper/Polyimide Material System for High Performance Packaging", 34th Electronic Components Conf., New Orleans, LA, 14-16th May 1984, pp. 73-81.

Venkatachalam: "Pulse Propagation Properties of Multilayer Ceramic Multichip Modules for VLSI Circuits", IEEE Transactions on Components, Hybrids and Manufacturing Technology, vol. CHMT-6, No. 4, Dec. 1983, pp. 480-484.

MODULE FOR PACKAGING SEMICONDUCTOR INTEGRATED CIRCUIT CHIPS ON A BASE SUBSTRATE

FIELD OF INVENTION

This invention relates to the field of integrated circuit chip packaging, and more specifically to packaging semiconductor chips on semiconductor substrates.

BACKGROUND

The integrated circuit chip packaging structure of the present invention provides high density integrated circuit packaging and excellent electrical performance (i.e. power distribution, impedance matching, minimal cross talk). In preferred form, this invention relates to using a semiconductor substrate as the base of a semiconductor packaging structure to which a plurality of integrated circuit chips are attached.

The concept of using a semiconductor substrate as a base substrate for a semiconductor packaging structure is known in the art. In particular, packages have been proposed using silicon as the base substrate, and having silicon chips mounted thereon. Major problems associated with these packages are that the power distribution systems are limited in their ability to appropriately provide power to the chips, and the inherent resistivity of the silicon make the substrate a poor media for transmitting signals.

The following references represent efforts made in this field of packaging.

Bergendahl et al., in an article published in the Proceedings of the IEEE Customs Integrated Circuits Conference, June 1985, titled "The Wafer Transmission Module—Wafer Integration Packaging" and in an article published in VLSI Systems Design, January 1986, titled "The Wafer Transmission Module", describe a silicon wafer substrate that contains interconnect wiring and power busses The Wafer Transmission Module uses silicon as a means for multi-chip wafer scale integration for the purpose of large scale integration. It allows many chips to share the same package without requiring 100 percent yield of the chips. Integrated circuit chips are diced, tested and mounted on the module and wire bonded to module interconnect wiring. The signal propagation time of the interconnections is minimized by the use of tall thin film lossy transmission lines which are known in the state of the art. Large line width and spacing improve the yield and reduce interline coupling but also limit wirability and density.

Similar techniques are also described by Johnson et al., in "The Significance of Wafer Scale Integration in Computer Design", in the IEEE Proceedings of International Conference Computer Design, October 1984. Johnson et al. do not provide packages with adequate connections to the outside world. Furthermore, the lack of isolation lines between adjoining signal lines requires substantial interline spacing, thus reducing overall wirability and density. The proposal lacks an efficient power distribution system, thus creating a highly resistive and inductive environment. Moreover, the absence of adequate control of the impedance limits the application of the teaching to low performance technology and makes it inadequate for bipolar circuitry, which requires controlled impedance and small voltage swings.

Technological advancements in the field of thin film technology have made the use of thin film metallurgy attractive in silicon based packaging structures.

Stopper et al. in U.S. Pat. No. 4,458,297 disclose an electrically programmable thin-film interconnection system. Layers of conductors, insulators and a special amorphous-silicon alloy are deposited and patterned on a silicon wafer with conventional processing techniques. The completed structure provides a large number of unconnected wiring elements that can be linked by electrically programmable fuses. Thus, any desired interconnection network can be derived from a standard process. The aforementioned technique has several limitations. The package lacks the flexibility and the compactness required by VLSI packages and lends itself to only low performance applications where the speed of electrical signals is not essential. Wirability is inherently limited. The use of antifuses creates serious stubbing problems due to signal reflections on all unterminated studs. Impedance is not finely controlled using the Stopper et al. package.

Spielberger et al., in an article entitled "Silicon on Silicon Packaging", published in the IEEE Transaction on Components, Hybrids and Manufacturing Technology, June 1984 describe a silicon-on-silicon package wherein silicon is used as a multi-chip substrate. A plurality of integrated circuit chips are flip bonded by controlled collapse joining to a silicon base substrate. The substrate provides the interconnections between chips and the next level of packaging. The substrate is then epoxy bonded to a ceramic substrate and the package is then completed by wire bonding and hermetically sealing. The proposed assembly uses interconnecting aluminum wires that are 50 microns wide and power busses that are 200 microns wide, thus having limited wiring density.

Otsuka et al., in UK Pat. No. GB 2,132,411 describe a silicon carbide substrate wherein high electrical insulation, high thermal conductivity and a coefficient of expansion similar to that of silicon is achieved. This concept is further expanded by Satoh, et al., in a paper presented at the International Conference on Computer Design of October 1984, "A High Speed Multi-Chip RAM Module with Thermal Stress Free Configuration", wherein face-down multiple LSI chips are bonded to a silicon substrate. The silicon substrate with LSI chips is bonded to a silicon carbide base. Silicon carbide has a dielectric constant of 40, thus degrading the electrical characteristics of the electrical signals because of the high capacitive nature of the silicon carbide.

Dielectrics such as polyimide are also utilized in silicon packaging applications. The ability to form fine lines, 5 microns wide, with thin film metal technology and fine spacings in multilayer additive substrates where polyimide is used as a dielectric demonstrates the potential of using thin film metal and polyimide.

Landis, of ITT Corporation, in an article titled: "High-Speed Packaging for GaAs Interconnection" published by the 35th Electronic Components Conference dated May 20, 1985 describes a multilayer, fine-line polyimide chip carrier containing nine 64-pin LSI chips. The fine-line, additive polyimide technology provides the capability of constructing a substrate whereby chip-to-chip interconnections have fully shielded coaxial conductors. Each semiconductor is assembled onto die attach copper studs and wire bonded to the substrate. The coaxial conductors have been designed to reduce the effects of cross-talk between adjacent high density signal lines. Whereas the package construction finds useful application for high speed operation, it is limited by the inherent complexity of the process. Furthermore, the significant number of metallization steps severely limits the final yield of the product, and the large amount of surrounding metal increases the capacitance of the signal lines thereby increasing the current demand and deteriorating the thermal characteristics of the package.

Chong et al. of Trilogy Systems Corporation in an article "A High Density Multichip Memory Module", published July 1, 1985 by Trilogy Systems Corporation describe an approach of using thin film interconnect technology to package a pluralrty of VLSI logic and memory chips on a single module as a means of achieving Wafer Scale Integration. The module is based on a thin film copper-polymer technology which displays advantages over multi-layer ceramic technology when comparing interconnect delays and interconnect densities. The module substrate is assembled in a conventional dual in line package upon which are mounted CMOS memory chips and chip capacitors for high frequency bypassing. The package lacks capability for high I/O density and is thus restricted to low performance applications. Thus, it would be inadequate for high speed, high I/O count, bipolar applications.

Magdo et al. in U.S. Pat. No. 4,023,197, disclose an integrated circuit chip carrier with multi-level metallurgy in which the effects of the metallurgy in causing irregularities at the various levels is minimized. Magdo et al. disclose a structure and a process to provide a carrier for advanced integrated circuit chips of high circuit densities which is structurally compatible with such chips. The package lacks a low inductance power distribution system and requires complex processing.

Thus, there is a need in the art for providing an improved semiconductor packaging structure having; a base substrate made of semiconductor material, alternating insulation and metallization layers, and semiconductor integrated circuit chips mounted thereon. An additional need exists for the semiconductor packaging structure to have efficient power distribution therein, and to provide high quality signal transmission (i.e. minimal cross-talk between signal lines, little or no dispersion, and matched impedances). Such signal transmission should be accomplished with minimum delay between successive signals, thus increasing the speed of signal transmission.

There is a further need in the art for the semiconductor packaging structure to provide high density wiring and have few wirability constraints.

The need also exists for the semiconductor packaging structure to have impedances that are matched so that resistance and capacitance between metallization levels is at a minimum.

A further need exists for there to be little or no thermal coefficient of expansion mismatches between the base semiconductor substrate and integrated circuit chips mounted thereon.

There is also a need for the semiconductor packaging structure to have a flexible wire rerouting system that can easily provide for engineering changes or repairs as required. The need also exists for the semiconductor packaging structure to have signal lines wherein the capacitance is low, thus decreasing current demands and decreasing the thermal output of the module.

There is a need in the art for a process of manufacturing the improved semiconductor packaging structure. A further need exists for a high yield process of manufacturing the semiconductor packaging structure. There is still a further need for the process to require a minimal number of metallization steps.

SUMMARY OF THE INVENTION

It is an object of this invention to provide an improved semiconductor integrated circuit chip packaging structure having a base substrate, alternating insulation and metallization layers, and semiconductor integrated circuit chips mounted thereon.

Another object of this invention is to provide efficient power distribution in the package.

It is another object to provide high quality signal transmission so that there is minimal cross-talk, minimal noise and dispersion and matched impedances.

It is a further object to assure high speed signal transmission.

It is still a further object to provide high density wiring in the package and to have few wirability constraints.

A further object is to keep the RC constant for the package to a minimum.

A still further object is to provide a flexible wire rerouting system within the package that can easily provide for engineering changes or repairs.

It is another object of this invention to provide a high yield process for manufacturing the improved semiconductor packaging structure.

These and other objects of the invention are accomplished by the packaging structure and process of the present invention which overcomes many of the disadvantages associated with prior packages.

Briefly, the package comprises a base substrate, preferably made of a semiconductor material such as silicon, alternating layers made of insulators and conductors such as polyimide and copper, respectively; and semiconductor chips mounted on an upper conductive layer. Wiring layers are typically formed of 5 micron wide copper lines and typical spacing between lines is approximately 5 microns. The wiring layers typically have ground, power and signal lines existing on the same plane with at least one power or ground line between coplanar signal lines, thus minimizing cross-talk. Power wiring lines of the same voltage level pairs of these planes are interconnected to form three dimensional power planes that provide excellent power distribution, minimizes capacitance that helps reduce the RC constant of the package and further minimize cross-talk. A personalized reference plane is provided which has insulating regions extending at least partially through the reference plane at predetermined locations that coincide with long signal lines on the wiring layers. The personalized plane lowers the capacitance in the package.

The process of fabricating this package is simplified and improved by forming interconnections between certain conductive layers with stepped conductive vias. Stepped conductive vias are formed by first forming a dielectric mound at locations where it is desired to interconnect layers and second depositing conductors over these mounds, allowing the interconnection of planes with a minimum of metallization steps and without the yield decreasing effects (i.e. pinholes in insulation) associated with forming vias in insulation. Processing is also improved by using vertical redundant metallization wherein two thin depositions replace one thick deposition step, and by using selective silylation of the dielectric insulating material. Selective silylation allows the upper surface of the dielectric to serve as an etch barrier during subsequent metallization steps, while the bulk of the dielectric retains its insulating properties.

BRIEF DESCRIPTION OF THE DRAWINGS

Other objects, features and advantages of the present invention will become more fully apparent from the detailed description of the preferred embodiments, the appended claims and accompanying drawings in which:

FIGS. 2-12 are described in detail in the Description of the Preferred Embodiments section of this application, specifically when the process for manufacturing the package is described. FIG. 12 represents the finished cross section.

FIG. 13 is most important for showing the organization of the three dimensional power planes and coplanar power, signal, ground planes which are described in the structure and process descriptions of the Preferred Embodiments section of the application. This drawing is conceptual in nature, and does not reflect actual dimensions or structural relationships.

DESCRIPTION OF THE PREFERRED EMBODIMENTS

The Process

Figure 2:
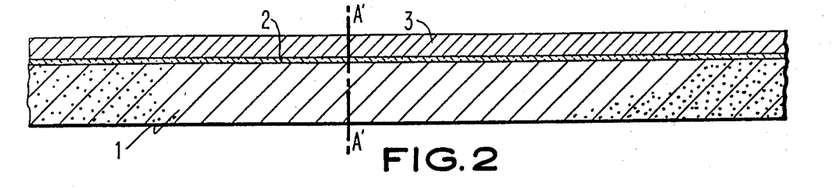
FIGS. 2-12 show the integrated circuit chip packaging structure in cross-section during various phases of its construction.

The process required to achieve the preferred embodiments of the present invention comprise a group of steps that are most easily understood by referring to FIGS. 2-13. FIG. 2 shows the substrate 1 which is used as the base of the semiconductor packaging structure. The substrate 1 can be made of any material having a smooth or polished surface; for instance, an insulating material such as silicon carbide, silicon nitride or ceramic; or a semiconductor material such as silicon or gallium arsenide or a low expansion metal or alloy, for example invar or molybdenum. Silicon is the preferred substrate material. The thickness of this base substrate may be typically in the range of approximately 10-40 mils, preferably approximately 25 mils. Base substrate 1 is coated with a passivation layer 2 of at least 0.5 microns and up to approximately 8 microns. The passivation layer 2 may typically be comprised of silicon dioxide or silicon nitride, both of which are deposited by techniques conventionally used in semiconductor processing such as sputtering or chemical vapor deposition.

A metallization layer 3 of approximately 1-15 microns, preferably approximately 2-5 microns, is next deposited by conventional means such as evaporating or sputtering over the passivation layer. Metallization layer 3 may serve as a reference voltage plane.

Figure 3:
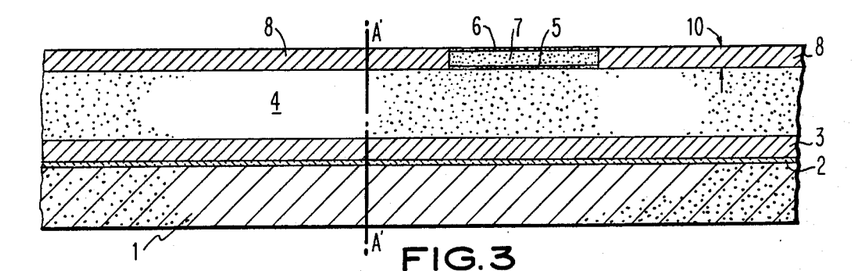

Referring now to FIG. 3, in the preferred embodiment, polyimide 4 is deposited to a depth of approximately 5-15 microns. Even though other polymers such as fluorocarbons or siloxanes, may be used, the preferred dielectric, polyimide, will be referred to when describing this process. Preferably, before the polyimide is cured, the polyimide layer 4 is treated by a selective silylation process so that a thin silylated film 5 of approximately 500-3000 Angstroms is formed. It is known by those skilled in the art that the detailed steps used to deposit polyimide layers may comprise first applying polyamic acid, and then heat treating to convert to the polyimide layer. Basically, the selective silylation process comprises baking the polyamic acid at approximately 75°-100° C., preferably approximately 85° C., to dry the solvent out of the polyamic acid, then exposing the polyamic acid to a solution of hexamethylcyclotrisilazane (HMCTS) and xylene with aprotic cosolvents such as NMP, DMSO or DMF for approximately 10-20 minutes, typically approximately 15 minutes. The solution is then heated, preferably approximately between 40° C. and 70° C. This eventually causes the cross-linking of the polyimide surface with methyl siloxane groups, and introduces silicon into the polyimide. The polyamic acid is then cured at a temperature of between approximately 200°-400° C., forming polyimide 4 having silylated surface 5. The silylated surface 5 of the polyimide layer 4 is inert to oxygen plasma processing or other etching techniques, and thus serves as an etch barrier for subsequent processing steps. Note that the silylated surface 5 preferably extends over the entire surface of polyimide area 4, but that only the area directly below polyimide area 7 is shown to be silylated for convenience. Note that organometallic reagents other than HMCTS may be used to form an etch barrier in the insulator also. Silylation is the preferred embodiment of forming such an etch barrier. The packaging structure may alternatively be built without forming an etch barrier, but the processing advantages associated with having the silylated surface serve as an etch stop would be lost.

Metallization 8 is then blanket deposited by conventional techniques such as evaporation or sputtering on silylated surface 5. Portions of the metallization 8 are selectively removed by conventional processes such as lift-off. Metallization is selectively removed from those locations where it would be beneficial to replace the metallization with insulation. For instance, package impedance is enhanced when added insulation is placed between wide signals lines, (i.e. 10-25 microns), and the layer of metal directly below such lines. Polyimide 7 with silylated surfaces 6 is then deposited in these depressions. The result of this personalized metallization 8 and coplanar polyimide 7 preferably having silylated surface 6 is a personalized reference plane 10. This reference plane can be at ground voltage or any other operating voltage that the package requires. Alternatively, polyimide may be deposited first, then etched where metal deposition is required.

As an alternative embodiment, reference plane 10 need not be personalized, so that metallization 8 covers the whole layer. Another alternative is to interconnect metallization 3 and metallization 8 with metal studs, thus forming one reference plane. The upper portion of this reference plane may be personalized in the same manner described above for reference plane 10. It is especially advantageous to personalize reference plane 10 whenever wide lines exist on subsequent layers because it is desirable to have a thick dielectric between that wide line and the layer of metal below that line to reduce capacitance.

Figure 4:
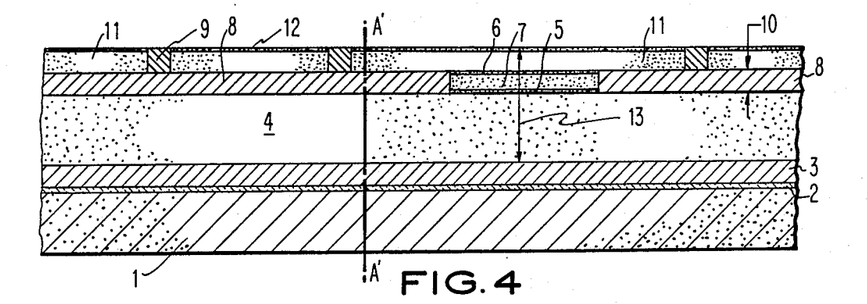

Referring to FIG. 4, following formation of personalized reference plane 10, polyimide 11 is deposited, and silylated surface 12 is created in the same manner described above wherein polyimide areas 4 and silylated surfaces 6 were created. At this point of the process a deep trench of polyimide insulation 13 has been created. Typically, the dimensions of this trench may range from approximately 15-30 microns, depending on the exact process steps used. This increased dielectric thickness greatly reduces capacitance between metallization on reference layers 3 or 10 and any wide metallization lines above polyimide trench 13. Polyimide layer 11, with silylated surface 12 has a surface that is inert to oxygen plasma processing so that it is an effective etch barrier, yet the bulk dielectric properties of the polyimide have no been altered. Thin film metallization is then deposited to form metallized studs 9. These studs bring the voltage up from the personalized plane 10 to subsequent layers of metal in the package. Thus, the studs may be ground or power studs, depending on the voltage of personalized reference plane 10.

To summarize the result of the process steps thus far, a personalized reference plane 10 has been formed, and ground or power has been brought up by metal studs 9 to the level that coplanar signal, ground and power lines will eventually be formed. Silylated surface 12 serves as an etch barrier for the following steps.

Figure 5:
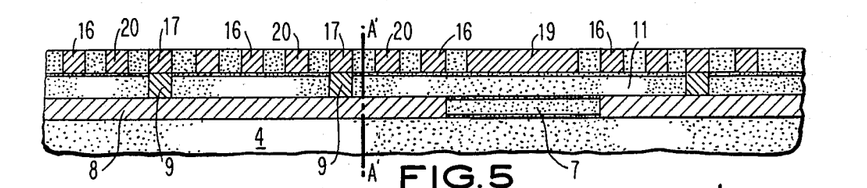

FIG. 5 shows the first level of coplanar power, ground and signal lines formed by this process. The patterned metallization that forms these lines may be formed by conventional additive or subtractive metallization techniques. Preferably, vertical redundant metallization techniques are used when depositing the patterned metallization. Vertical redundant metallization utilizes a plurality of metallization depositions to replace any single metallization deposition to reduce the chances of voids or opens in a metallization pattern. Typically, conductor patterns are deposited in two separate steps so that a parallel conductive metallization structure will exist over or below any voids or opens present in either single pattern. A preferred embodiment is to form the first patterned conductive layer by conventional metal liftoff techniques, then aligning an identical patterned mask directly over the first metal and again forming a patterned conductor layer by metal lift off techniques. This metallization technique is very successful in reducing or eliminating voids or opens because the probability of random voids or opens that are formed in either of the distinct patterned layers overlaying is minimal. This drastically increases the processing yields of the package. The vertical redundant metallization technique has numerous packaging applications in which thin film metallization may be used. For example, state of the art multilayered ceramic packages incorporate thin film redistribution structures such as those described in U.S. Pat. No. 4,221,047. Thus, to increase the yields of multilayered ceramic packages having thin film redistribution structures incorporated, the vertical redundant metallization techniques described herein may be used to successfully increase yields.

The lines of the power, ground, signal plane are substantially parallel to each other, and the pattern may be at any suitable angle, preferably running either horizontal (X-Cartesian coordinate) or vertical (Y-Cartesian coordinate) in the power, ground, signal plane. Preferably, this first level of power, ground, signal thin film metal runs in the X direction. In preferred form, ground lines 17 are brought up from personalized reference plane 10, and there is at least one ground or power line between any two signal lines. Thus, a typical example of wiring of this first plane is as shown in FIG. 5; signal lines 20 run between ground line 17 and power line 16; wide signal lines 19 are also separated from other signal lines by power lines 16 or ground lines 17. There will be a relatively small number of wide signal lines 19, the precise number of which depends upon the particular wiring of the package. The wiring dictates the number of lines that must run a longer distance than the average line. These lines are made wider so that the voltage drop across these lines will be approximately the same as the shorter lines 16, 17, 20. This results in a much more conductive line that can run a longer distance without signal attenuation.

The dimensions of all of these lines may vary as per particular electrical and density requirements, for example, in a 2-inch square CMOS package, the preferred line thickness (i.e. height) is approximately 3-5 microns, and preferred line width is approximately 4-8 microns for standard width lines such as lines 16, 17, 20. Note that the dimensions given are exemplary, and that other factors such as desired voltage drop across a required distance, and package size influence the ultimate line size required. Wide lines 19 typically use the same area as a multiplicity of normal lines, but the dimension may be customized to the limits of the state of the art of thin film technology. These lines may typically be between 15 and 25 microns in a 2-inch square CMOS package.

Figure 6:
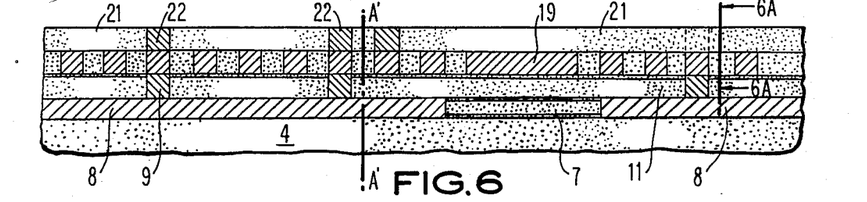

Referring to FIG. 6, a dielectric, preferably polyimide 21, in the range of approximately 3-15 microns, preferably 5-10 microns is coated over the structure. Metal studs 22 are formed in the polyimide 21 by conventional means (i.e. etching vias in the polyimide, then filling the vias with metal). Metal studs 22 form connections between selected coplanar power, ground, signal lines on the X wiring level with selected coplanar power, ground, signal lines on the subsequently deposited Y-level wiring.

Figure 6A:
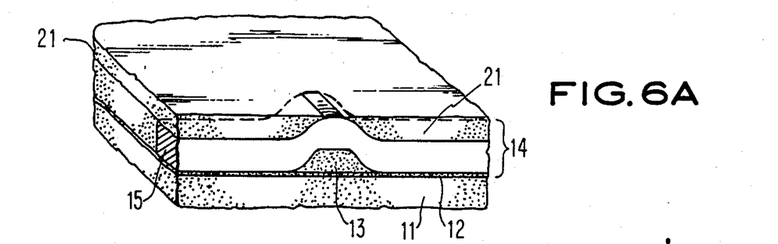

A preferred alternative to forming metal stud interconnections 22 between the X and Y levels of coplanar power, ground, signal lines is to use stepped conductive vias 14 (FIG. 6A) at all locations where studs 22 may be used especially where planarized surfaces are desired. FIG. 6A shows a stepped conductive via 14 which can be formed when the first level of coplanar power, ground, signal metallization is deposited. Metallization lines 15 are formed over mounds 13, causing lines 15 to protrude so that portions of lines 15 are in a different plane than the majority of metal formed during this process step. The combination of a mound 13 and metallization line 15 is referred to as a stepped conductive via 14. By forming this stepped conductive via, lines 15 from a first metallization level are connected to lines 24 of the subsequent level of metallization. This method of forming interconnections between wiring planes is preferred over conventional methods of interconnecting planes such as forming metal studs between the layers as done above when metal studs 22 were formed. By forming stepped conductive vias, the connection between two coplanar power, ground, signal planes may be accomplished at the same time that the first power, ground, signal plane is formed. This saves a metallization step, which is very important in view of the fact that yields decrease as levels of thin film metal are added to a structure. For example, it is only recently that four levels of thin film metal has been possible in the manufacture of semiconductor chips from a practical standpoint because of the low yields resulting from four level thin film metal processing. The stepped conductive vias are particularly useful where it is important to have planarized surfaces, such as the patterned conductive wiring layers. The planarization is important because it makes processing easier and enhances electrical performance. The stepped conductive vias allow us to achieve planarized surfaces because after metallization line 15 is formed on mound 13, and then a subsequent dielectric insulation film is deposited, the dielectric insulation film 21 is uniformly etched back to expose out of plane metallization 15. The result is that the surface of metallization 15 is coplanar with the dielectric surface. The resultant integral dielectric/metallization 15 surface is substantially more planar than the surface would be if standard studs were used. Thus, stepped conductive vias are typically used when forming the patterned wiring layers and forming three dimensional power planes by interconnecting power lines of the same voltage level from a pair of patterned conductive wiring layers.

Yields are also increased by forming stepped conductive vias to interconnect levels of metallization because etching into the polyimide dielectric is not required to form such interconnections. The etching causes pin holes and interlevel shorts, which are two primary causes of low yields and failures. By using stepped conductive vias 14, and thus eliminating etching of vias for interconnection, these failures are minimized and yields are increased.

Figure 7:
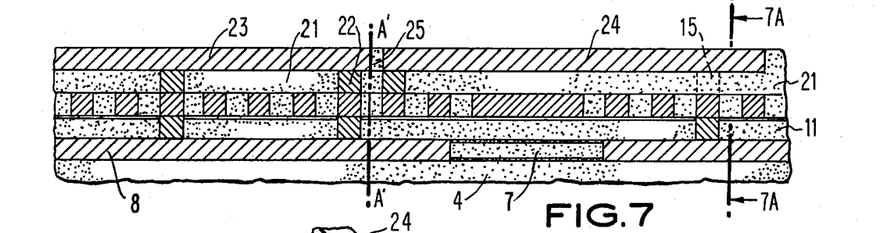
Figure 7A:
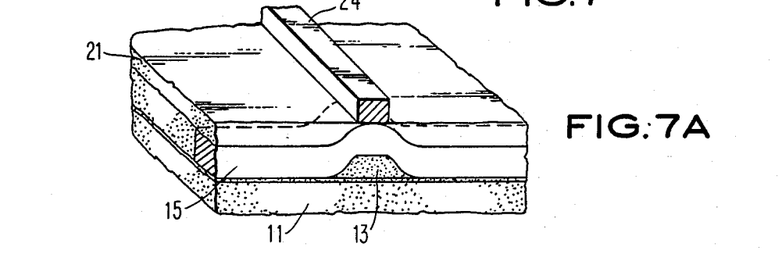
Figure 13:
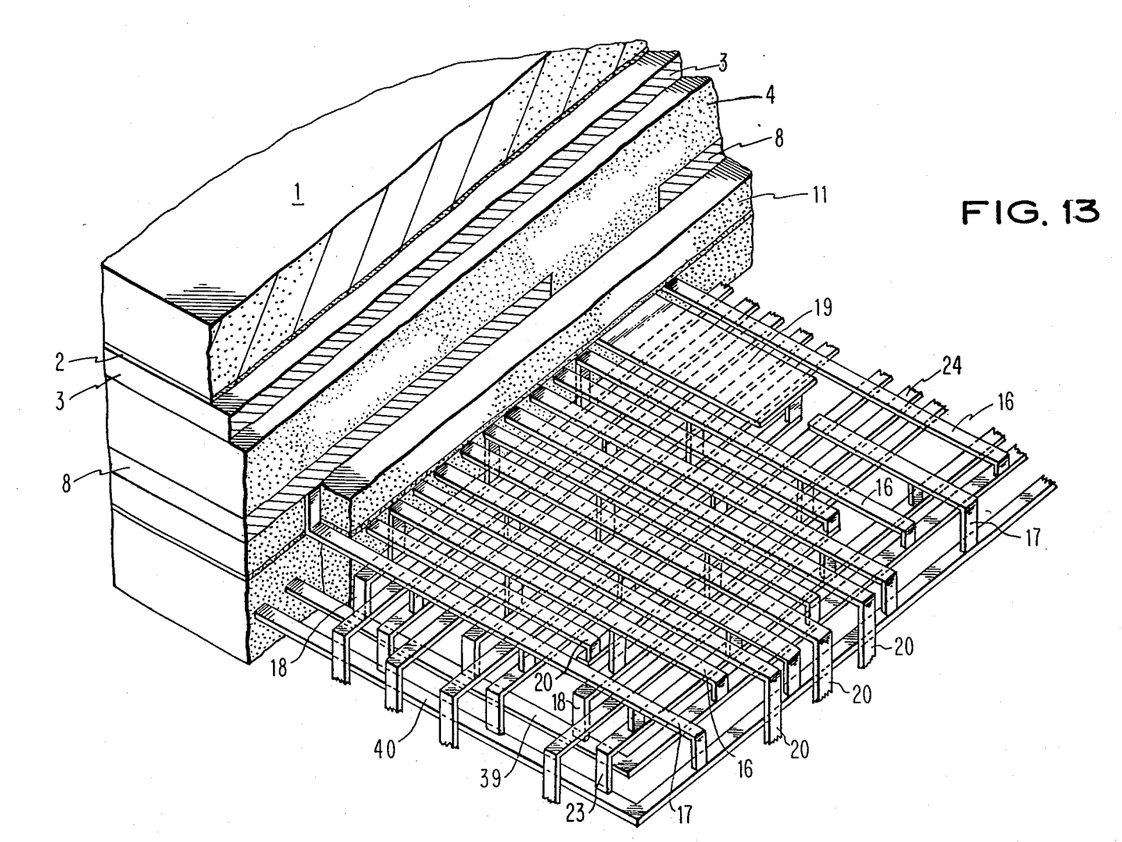
FIG. 13 shows a perspective view of the package with specific layers being broken out. This view is inverted to show the broken out layers in the clearest manner.

Referring to FIG. 7, after either the stepped conductive vias 14 (see FIG. 6A) or studs 22 are completed, a second level of patterned metallization is deposited using conventional thin film techniques. This will result in signal lines indicated as 24 and power lines i.e. 23. These lines are typically run in the Y direction, making 90 degree angles with the first level of thin film metallization wiring which typically runs in the X direction. Other embodiments are possible, for example wherein the Y level metal is formed on a lower plane, and then X level metal is formed on a subsequent plane, or wherein the metallization lines on each level run at any suitable angle with respect to each other. Referring to FIG. 13, at this point, the three dimensional power planes have been formed. One three dimensional power plane is comprised of wiring lines 16 from the X wiring plane which are interconnected with wiring lines 18 from the Y wiring plane. Another three dimensional power plane is comprised of wiring lines 17 from the X plane which are interconnected with wiring lines 23 from the Y wiring plane. FIG. 7A shows the stepped conductive via 14 after Y level metallization, i.e. 24, that interconnects with the X level is deposited.

Figure 8:
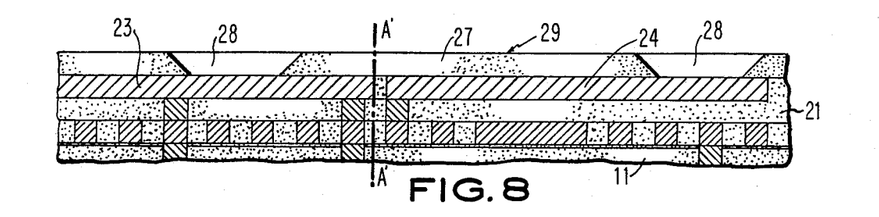

Referring to FIG. 8 polyimide 27 is formed into a layer by conventional processing. At this point conventional vias are typically used because planarization is not as vital as in the prior steps because the critical fine line lithography steps have been completed at this point. Conventional vias 28 would typically be formed by reactive ion etching of the polyimide using standard reactive ion etching via technology.

Figure 9:
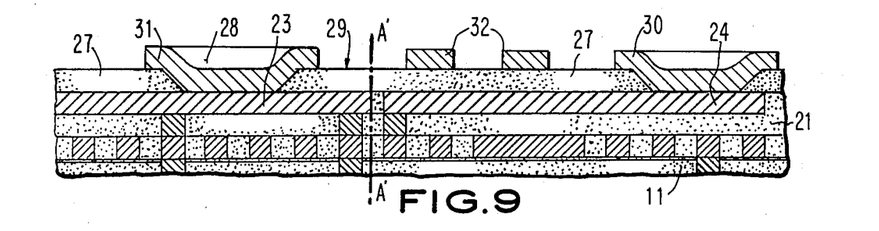

Moving to FIG. 9, metallization 30 and 31 is formed in vias 28, forming test pads and probe pads that will eventually connect to top surface metallurgy. They are formed by using conventional thin film techniques, liftoff being a preferred embodiment. In between any signal pads 30, preferably are formed engineering change and repair lines 32. The engineering change and repair lines 32 form a grid of lines joined at substantially every intersection. The grid can be reconfigured by selectively etching lines to create engineering changes or repair any opens or shorts in the lower signal levels by rerouting lines through the reconfigured grid. After metallization 30, 31, 32 is deposited, and any engineering changes or repairs are made, polyimide 33, (FIG. 10) is deposited over the exposed surface, thus burying the engineering change and repair lines. Those skilled in the art will appreciate that polyimide 33 can also be deposited then selectively etched, leaving pads 30 and 31 exposed for the subsequent steps.

Figure 10:
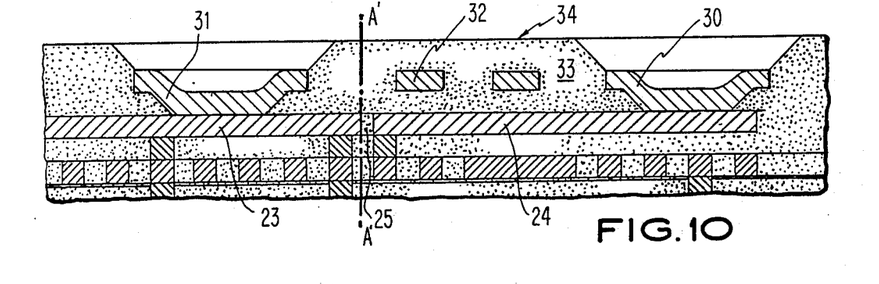
Figure 11:
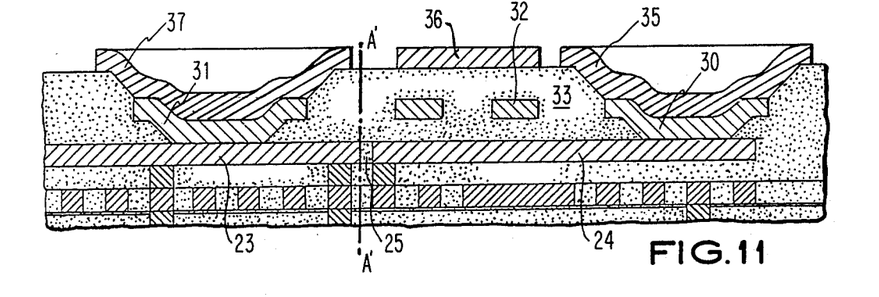

In FIG. 10, in preferred form, polyimide 33 is removed from pads 30 and 31, exposing these pads. This polyimide is typically removed by reactive ion etching or other conventional methods. The engineering change and repair lines are kept buried. In FIG. 11 top surface metallurgy 35, 36, 37 is deposited. In preferred form, where solder ball chip joining is used, this top surface metallurgy is ball limiting metallurgy 35, 37 where solder balls form connections between connector pad areas 35, 37 on the package and connector areas on chips which are mounted on the package. In those areas of the top surface where there is no ball limiting metallurgy required, it is preferred that the otherwise empty top surface area be used to bring additional power to the top surface. To accomplish this, metallization lines 36 are formed on the top surface, typically in the areas between ball limiting metallurgy 35, 37. The resultant power lines 36 that are formed on the top surface are most clearly shown in FIG. 1 where the power lines 36 are shown to be connected to peripheral power bus 39.

Figure 12:
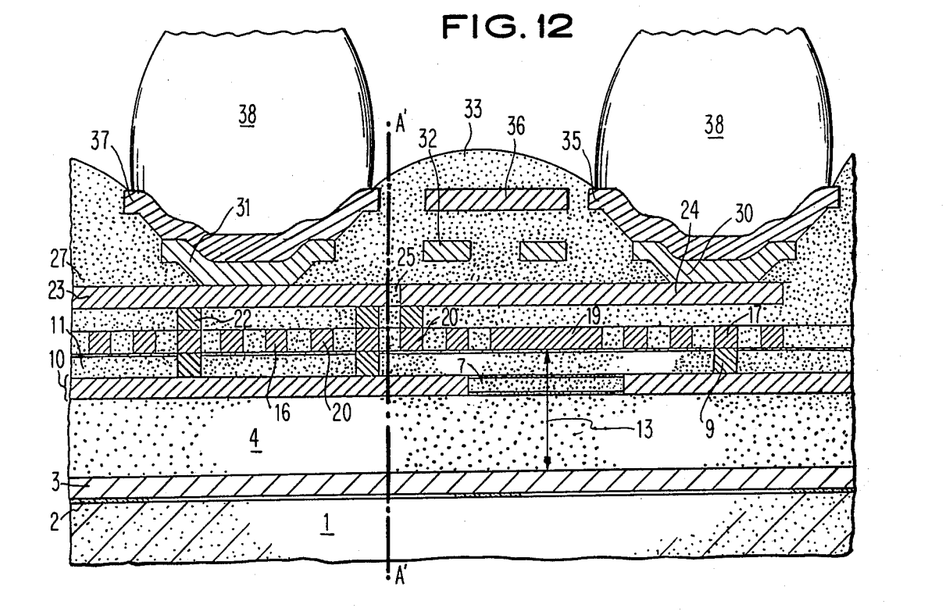

Referring to FIG. 12, the final insulation layer of polyimide 33 is placed over the top surface metallurgy. This will ball limit the metal and prevent it from spreading into power lines 36. Solder ball joints 38 are then formed on ball limited metal areas 35, 37. The dimensions of the solder balls are typically 1–10 mils. If solder ball joints are not used to join the chips to the semiconductor package, those skilled in the art will appreciate that alternative means and methods of chip connection may be used i.e., tabs or wire bonding. At this point we have described the formation of the preferred package except for the peripheral power busses 39, 40 which are the preferred means for distributing power in the package.

Figure 1:
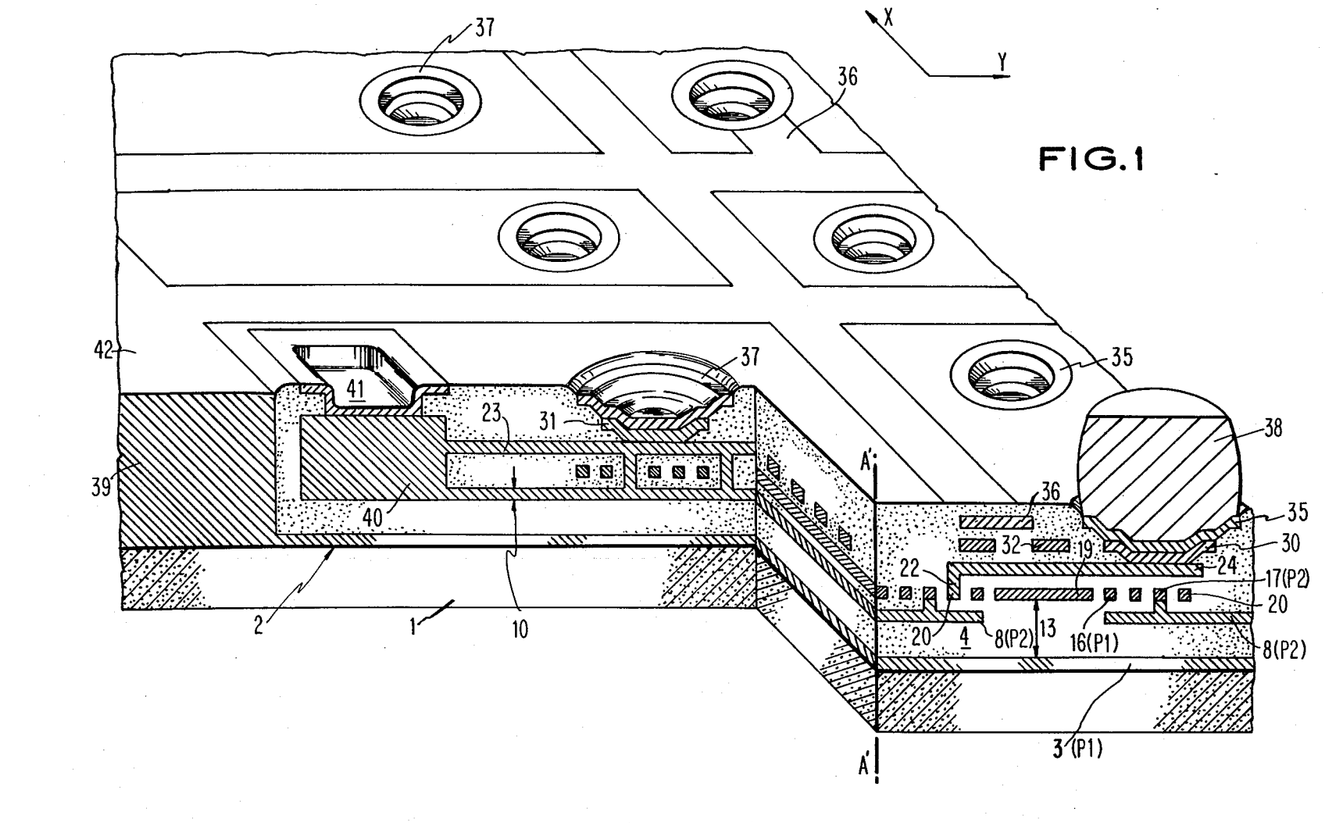
FIG. 1 shows a perspective view of the integrated circuit chip packaging structure that is cut along plane A'-A' to show the internal layers and power busses of the package.

To clearly describe the formation of the peripheral power busses 39, 40 which bring power to the top surface and reference planes, reference is made to FIG. 1. The power busses 39, 40 are typically at two different voltage levels; power 1 and power 2, which may typically be different operating voltages, the specific operating voltages depending on the specific packaging application. Power bus 40 is formed further from the periphery than power bus 39. As to the fabrication of power busses 39 and 40 they are fabricated by making multiple metal depositions, each deposition occurring during the formation of any given plane at the same time that the various consecutive levels of signal and power lines and vias are fabricated within the structure itself. Thus, after the passivation of the silicon substrate with insulator 2 as shown in FIG. 2 and during the formation of reference plane 3, the bottommost portion of power bus 39 is also formed by depositing metal in the area of bus 39 concurrently with depositing metallization to form reference plane 3. As insulation is then deposited to form insulating layer 4, metallization is added to the bottommost layer of power bus 39, building up the power bus structure. At the point where the second reference plane (i.e., personalized plane 10) is formed, we simultaneous deposit metal to continue to form power bus 39 and to form the bottommost portion of power bus 40. From that point onward as any given layer is formed, power busses 39 and 40 layers will simultaneously be laid down at either a signal via or power level typically up to the top surface metallurgy. Because of space limitations, and the detail of design that must be shown in the drawings, power busses 39 and 40 are not shown to scale. The actual width of each power bus is actually at least 0.5 mm, preferably approximately 1 mm. The geometric structure of the power busses may vary also, for example, above the Y wiring level, the power bus metallization may typically resemble metallization 31 and 37. Note that power busses 39 and 40 are convenient means to bring power to the individual layers and top surface of the package. Those skilled in the art will appreciate that alternative power distribution means may also be utilized.

At this point we have a completed package which is in condition to be connected to the next level of packaging (i.e. board or card), for example, by wire bonding from the edge of the substrate.

The Structure

The preferred embodiment of the semiconductor packaging structure is best shown referring to FIGS. 1, 12 and 13. FIG. 12 represents the cross section of an interior region of the semiconductor package shown in FIG. 1. FIG. 13 represents a partial portion of the semiconductor package and is inverted to show the broken out layers in the clearest manner possible. FIG. 13 is conceptual in nature and does not represent the physical structure accurately as do FIGS. 1 and 12. The major purpose for FIG. 13 is aid in demonstrating the three dimensional power planes and to demonstrate the electrical advantages associated therewith.

Referring now to FIGS. 1 and 12, the particular structure of the preferred embodiments are described. A substrate, reference numeral 1, having a polished surface is used as the base of the integrated circuit chip packaging structure. The thickness of the substrate may be in the range of approximately 10–40 mils. The substrate 1 may be made of any material having a smooth or polished surface, for instance, an insulating material such as silicon carbide, silicon nitride or ceramic; or a semiconductor material; or low expansion metal or alloy. In preferred form, the substrate is made of silicon, gallium arsenide or any other semiconductor material that may be used to fabricate integrated circuit chips. This provides matched thermal coefficients of expansion between the chip and substrate 1. The preferred embodiment is described herein as having a silicon substrate, even though other materials may be used. A passivation layer 2 of silicon dioxide, silicon nitride, glass, quartz or other suitable insulator, rests between the silicon substrate and any metallization layers that will subsequently be deposited. Reference numeral 3 represents a first reference plane in the package. It is made out of aluminum or copper or any other conductive material that is easily deposited, particularly preferred is copper because of its excellent electrical conducting properties and its easiness of application. The thickness of reference plane 3 is approximately 1–15 microns, preferably 2–5 microns. Note that in FIG. 1 it is shown that reference plane 3 also serves as the bottom most layer of power bus 39. Reference plane 3 and power bus 39 are at the same voltage level and supply a reference for that voltage level and a distribution means for that voltage level throughout the package. As an example, in a typical CMOS application this voltage level may be 5 volts.

Insulation layer 4, preferably made out of polyimide exists in a thickness of approximately 5–15 microns, preferably approximately 4–6 microns. Polyimide is used because of its excellent dielectric properties and because of the fact that it may be easily applied with state of the art technology.

Referring to FIG. 1, it is noted that power bus 39 exists preferably toward the periphery of the substrate and that no metallization is deposited at other sections of insulation layer 4. This power bus ultimately supplies voltage to reference plane 3. The surface of polyimide layer 4 is a silylated surface. This silylated surface is shown in FIG. 2 as reference numeral 5, and its purpose is to help facilitate processing by serving as an etch barrier when subsequent metallization layers are deposited and patterned while allowing the polyimide insulation to keep its bulk dielectric properties.

As shown in FIGS. 1 and 12, plane 10 is comprised of conductive material 8, preferably thin film metallurgy, i.e. copper, that is personalized, having areas filled with polyimide material 7.

The polyimide areas 7 are preferably situated in areas that are directly below wide signal lines 19 that will be formed on a subsequent layer of metallization. In a package where 5 micron wide lines predominate, these wide signal lines may be from approximately 15 to 30 microns wide, depending upon the distance that the wiring line must run in the package, i.e., the further the distance, the wider the line must be. The polyimide area 7 and metallurgy 8 that are put down in the same layer comprise personalized reference plane 10. This plane may be at either a specific voltage level or a ground level as may reference plane 3. Plane 3 which can be any voltage level or ground level in the package is the reference plane below wide signal line 19. By having additional insulation in area 7 between wide signal line 19 and reference plane 3 the capacitance between these two metallization areas is decreased, thus enhancing package performance.

The personalized reference plane 10 has openings formed and filled in with polyimide 7 in locations where wide signal lines exist on the subsequent layer because it is the wide signal lines that in conjunction with the level of metal below them cause the largest capacitance problem. The purpose of personalized reference plane 10 is to minimize the capacitive effect between wide lines on the first wiring layer and lower reference plane 3. The dielectric regions between the lines 19 and metal 3 is equal to approximately 15–30 microns. This dielectric area is represented by 13 in FIGS. 1 and 12. Note that if there was no personalization the distance between a wide signal line and closest metallization would be approximately 5 microns i.e., the width of polyimide layer 11. This personalized reference plane thus allows us to maintain high impedance for wide lines. This is required because the lines that are wide are formed in that manner because they must travel long distances on the wiring plane. By allowing the lines to be wide without an adverse capacitive effect, the impedance can be kept high enough so that the proper current can be carried on this wide line. This allows impedance matching in the package, and minimizes adverse capacitive effects.

Polyimide layer 11 has conductive vias 9 therein. The purpose of these vias is to carry voltage from personalized plane 10 up to the first level of wiring wherein ground or power lines are interspersed with signal lines in such a manner that no two signal lines 20 or 19 are directly next to each other. The conductive vias 9 carry the voltage from plane 10 to the appropriate wiring locations of the same voltage on this interspersed plane. The interspersed plane in this embodiment is comprised partially of lines at a voltage level which is the same voltage level as layer 3. The specific voltage is application dependent. The power lines are represented by reference numerals 16. Lines 17, which are at the same voltage level of reference plane 10, are coplanar with signal lines 19 and 20. All signal lines 19, 20 are isolated from each other by either at least one power line, 16 or 17; lines 16 and 17 being of operating voltage or ground voltage depending on the particular application that the package is used for. This minimizes cross-talk between signal lines by as much as an order of magnitude. Typical signal and power line widths are in the range of 3-5 microns, providing a very dense wiring structure. In fact two levels of wiring in this package can provide the same density as a 30-40 layer multilayered ceramic package of the same perimeter dimensions. As lithography capabilities improve, the density of this packaging structure can be increased accordingly by adding additional metal levels. Where long connections are required and where excessive DC current flow considerations necessitate a low resistance line the signal line can be widened (i.e., typically from 10-30 microns), but its capacitance per unit length and characteristic impedance maintained because of the personalized reference plane 10.

Figure 14:
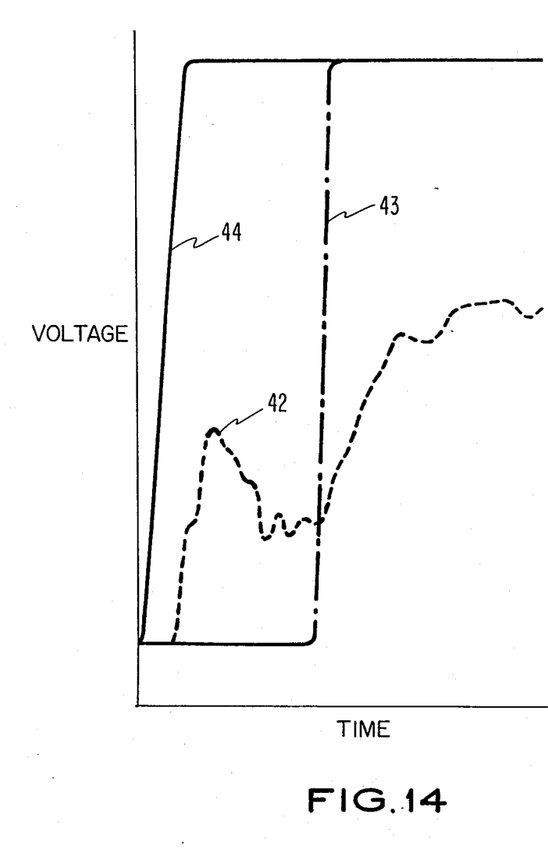
FIG. 14 is a graph showing the switching of devices in a standard multilayered ceramic package. Time is plotted on the abscissa (X-axis) and voltage is plotted on the ordinate (Y-axis).
Figure 15:
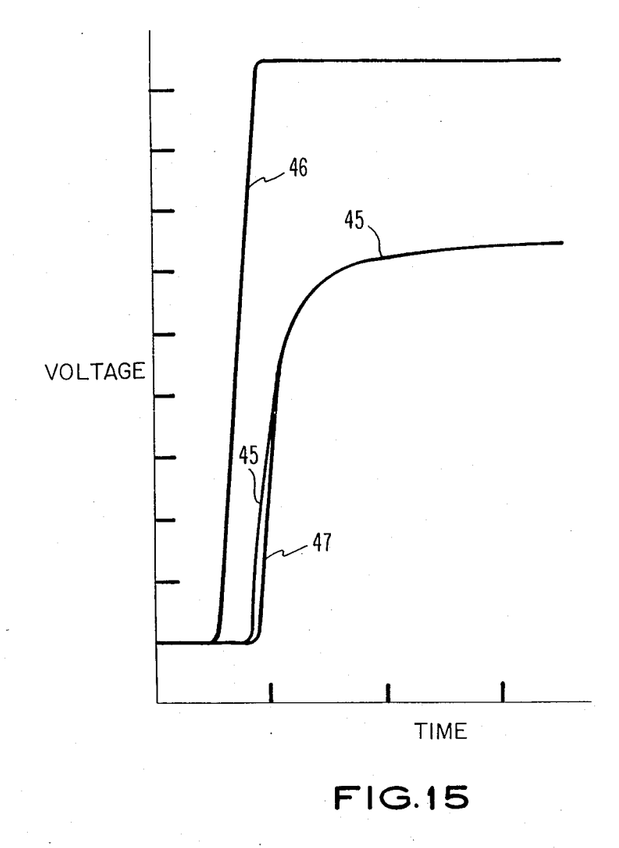
FIG. 15 is a graph showing the switching of devices in the packaging structure of the present invention.

Because of their relatively small size, the signal lines on this layer are relatively resistive compared to other types of packages. Analysis has shown that the resistive qualities of these lines can be very effective in reducing propagation delay times by transforming a multi-incident switching net to a first incident switching net. Gains up to 30 percent over conventional ceramic packages have been noticed, especially in unterminated driver and receiver applications (i.e. CMOS). FIGS. 14 and 15 which show graphs of these delay advantages, and are explained further in the Operation section of the specification.

Referring to FIG. 1, power bus 40 supplies a second voltage level, which in this embodiment is supplied to metallization 8 of personalized plane 10. Metallization 8 which comprises the metallization of personalized plane 10 forms the lower level of power bus 40. Dual power busses 39 and 40 are the preferred embodiment for bringing power to the appropriate reference planes and power lines of this packaging structure. The lines on this first wiring level, lines 16, 17, 19 and 20, are all parallel to each other. In preferred form these lines run in the Cartesian X direction. However, those skilled in the art will appreciate that they can run at any direction as long as they are substantially parallel to each other. As most clearly shown in FIG. 5, note that in the presence of wide lines 19 there is an insulation area 7 in the personalized reference plane directly below. This allows for the large dielectric thickness 13 (FIG. 1) to exist, thus reducing capacitance as described above. The insulation, preferably polyimide 21 exists between lines on this first level of wiring, and polyimide 21 is also between this first level of wiring and the subsequent level of wiring. Vias 22 interconnect the first and second wiring layers. These vias are typically thin film metallurgy of the same type as the wiring, i.e. copper. In preferred form these vias are stepped conductive vias. Reference is made to FIGS. 6A and 7A for the precise configuration of the stepped conductive vias 14, as it would be confusing to show these in FIG. 1 or 12. The stepped conductive vias 14 provide the advantages of allowing a minimum number of metallization steps to be used in forming interconnections between wiring levels, allowing higher yields because of less pinholes and defect areas in the insulation 21, and they facilitate the formation of a planarized surface which is very important between wiring planes because the lines on these planes are typically thin film lines, and electrical performance can be adversely affected if the surfaces that the thin film lines are formed on are not planar. Each stepped conductive via 14 is comprised of a dielectric mound 13 and metallization 15 deposited thereon. Above the first layer of ground, power and signal coplanar lines (i.e., lines 16, 17, 19, 20) and connected by either conventional vias 22 or stepped conductive vias 14 is the next level of patterned metallization. In preferred form this next level of patterned metallization has lines running orthogonal to the lines formed in the first level. Thus, if the lines in the first level run in the X direction, then lines 23 and 24 will run in the Cartesian Y direction. As shown in FIGS. 1 and 12, line 24 is a signal line connected to signal line 20 by a via, either conventional via 22 or preferably stepped conductive via 14; and line 23 is a power line connected to power line 17 from the X level of metallization. Substantially all of the power lines of the same voltage level (i.e. voltage level 1) on the X direction wiring plane are interconnected with substantially all of the power lines of the same voltage level (i.e. also. voltage level 1) on the Y wiring plane. The power lines of other voltage levels are also interconnected in similar fashion. This is best shown in FIG. 13, which shows structural organization that leads to important electrical performance advantages of this package that are possible because of the power distribution system utilized. In FIG. 13, it is shown that each power line from the X level metallization at a designated voltage i.e., lines 16 are interconnected to each line of a corresponding voltage on the Y level of metallization, i.e., lines 18. Also each line of the second voltage of the X wiring layer i.e., lines 17 are interconnected to each line of the same voltage on the Y wiring layer i.e., lines 23. On the Y wiring level, polyimide insulation 25 (see FIG. 7) exists between the lines of metallization. Thus, two power planes are formed, each one being three dimensional in nature consisting of power lines on the X level, power lines on the Y level, and interconnections therebetween.

FIG. 1 shows the actual interconnection of these two planes whereas for organization FIG. 13 is referred to. Power busses 39 and 40 are a preferred source of power to the layers of the package, however, those skilled in the art will appreciate that alternate means are available. Note that besides the interconnecting of like power lines on each of the X and Y layers, some of the signal lines are also connected. For example, signal lines 20 on the X layer and 24 on the Y layer.

The power lines which are connected through a system of vias going from layer X to layer Y typically form a square hatched meshed plane in three dimensions, the electrical characteristics of the square hatched meshed planes are extremely low inductance and low resistivity and provide a return path for any signal that is initiated by the chip. Therefore they have electrical properties which are highly desirable. This will be clearly demonstrated in the Operation section of this specification. To further enhance electrical performance, decoupling capacitors may be incorporated either on the top surface of this module, or in the base substrate 1 itself by appropriately doping the base substrate.

Above the Y wiring layer is another layer of polyimide, layer 27. Layer 27 can be made of polyimide or other dielectrics i.e., quartz, etc. The metallurgy 30, 31 which exists in and on layer 27 is test metal which may be used to aid in testing the substrate from a DC point of view. The metal is typically thin film metallurgy of the same type as the wiring, i.e. copper. Structures 32 are a grid of engineering change and repair wires which can be cut and rerouted using photolithography, and reconnected to repair defects in the package or make any required engineering changes. The global wires comprise a grid of thin film metallization lines that are shorted together at all grid intersections. The grid is located above the uppermost patterned conductive layer in the package so that lines of the grid can be accessed for selective rerouting in the event engineering change or repair is required.

Metallization 35, 37 is chrome/copper/gold ball limiting metallurgy layer which is used to form solder ball joints in present day multilayered ceramic applications. Solder ball joints 38 are the preferred means which will form the interconnection mechanism with the chip. Solder ball joints 38 typically used are disclosed in U.S. Pat. No. 3,495,133 which is hereby incorporated by reference.

Those skilled in the art will appreciate that the structure may have different specific configurations than those shown. For example, metallization 30, 31, 37, 38 may not be required if chip connection means other than the solder ball joints disclosed in U.S. Pat. No. 3,495,133 are used, or if the testing of modules is not desired. Similarly, engineering change and repair lines 32 may be eliminated if such rerouting flexibility is not desired. Other modifications known to those skilled in the art may also be made without leaving the scope and spirit of this invention.

After chips are mounted, the completed package is connected to the next level of packaging (i.e. board or card). These connections may be made by conventional means such as wire bonds, tabs or decals. For example, power from external power sources may be introduced to the packages power bus structures, 39 and 40, by forming a connection between an external power source and metal areas 41 and 42 which are exposed on the top surface of power busses 40 and 39 respectively. Signal lines can get outside of the package by conventional peripheral attachments.

Advantages over the art are evident from the following operation section which describes the performance of the disclosed packaging structure made by the disclosed method.

Operation

Clear performance advantages exist over state of the art packaging structures. The advantages are illustrated as follows:

Power distribution is enhanced by the aforedescribed three dimensional power planes wherein power lines of the same voltage level from two wiring layers are joined together at regular intervals as shown conceptually in FIG. 13. If the patterned wiring layers each have wiring lines that run in the X and Y directions respectively, and orthogonal to each other, then the resultant three dimensional power plane will be a square hatch meshed plane in three dimensions. Other geometric configurations are also possible. These three dimensional planes enhance power distribution in the package. The power distribution is typically as follows: power is brought in through a multiplicity of connections typically to dual busses on the substrate 39 and 40. Each bus is at a different operating voltage. The busses connect to each of the three dimensional power distribution network. The structure provides for unusually low inductance and low resistance power distribution, and the interconnection of the X and Y power planes provides a plurality of paths for current when such demand is made by the chip. With decoupling capacitors incorporated into the package, the low inductance power distribution is in the range of 20-50 ph which is a major improvement over multilayered ceramic packages with decoupling capacitors incorporated, whose package inductances are typically in the range of 200 ph. The fact that the individual power lines of these three dimensional planes are adjacent to the signal lines on these planes provides an immediate return current path lowering the effective inductance even further. This low inductance also contributes heavily to enhancing the simultaneous switching capability of the package. Since the signal lines are interspersed with power, the cross-talk between signal lines is extremely low because the interspersed power lines provide extremely efficient shielding. Therefore the coupled noise in the entire system is orders of magnitude less than any other package that we have seen to date. For example, the saturated coupled noise in a typical CMOS type multilayered ceramic package is in the range of 0.5-1 volt, whereas for the present package, coupled noise is approximately 0.04 volts. The high resistivity of the signal lines which is inherent with small dimension metal lines assist in the delay properties for most unterminated driver and receiver applications, (i.e., CMOS). The high resistivity reduces reflections thereby creating a first incident switching characteristic which in our calculations has enhanced the delay properties of the packages that have been investigated to as much as 30 percent over multilayered ceramic packages.

The line resistivity in the present silicon substrate package is in the range of 2-18 ohm/cm. This is relatively high compared to other packages, for example, in multilayered ceramics, the line resistivity is approximately 30 m$\Omega$/cm. In most applications where multi-incident switching is prevalent, high resistivity reduces reflections and effectively brings about a first incident switch, and hence speedier transmission.

The increased transmission speed of the present package is evident from the curves shown in FIGS. 14 and 15, which show the switching speeds of CMOS chips packaged on a multilayered ceramic package, and the present silicon substrate package respectively. Referring to FIG. 14, reference numeral 42 represents the voltage waveform of the chip driver in the multi-layered ceramic package. The numerous dips and irregularities represent reflections that cause noise and ringing. Reference numeral 43 is the point at which the chip receiver switches on. Reference numeral 44 represents the driver input signal. The X distance between lines 43 and 44 represents the required switching time.

Referring to FIG. 15, reference numeral 45 represents the voltage waveform of the chip driver as seen at the receiver end of the transmission line. Reference numeral 47 represents the point at which the receiver switches on, and reference numeral 46 represents the driver input signal. Note that the relative distance between lines 46 and 47 (i.e. switching time) is substantially less than the switching time required in FIG. 14 for multilayered ceramic packages. Also, there is substantially no dips, irregularities or reflections in the present package. On the average, packaging delays are decreased by approximately 30% by using the present package rather than multilayered ceramic packages.

The present package also provides impedance control throughout the package, through a variety of means, i.e., impedance variation can be accomplished by varying the spacing between signal and power lines without affecting the periodicity. Also test metal 30 and 31 in FIG. 12 can be used to enhance power distribution as well as control impedance for Y lines in a manner similar to what has been done with wide X lines and personalized ground plane. The characteristic impedance of a package described herein is typically in the range of approximately 45 to 55 ohms. For the most part, this is possible because where long length signal lines are required to form interconnections, and lower resistance signal lines are therefore required, the signal lines are broadened in width. Personalized reference plane 10, which is preferably hollowed out under those locations where wide signal lines 19 are required such that reference layer 3 will effectively be the impedance controlling plane for wide signal lines 19. This provides a large dielectric area 13 between the wide signal lines 19 and reference plane 3. Thus, impedance control can be maintained, while keeping package capacitance and reflections to a minimum. Due to the low capacitance and low noise characteristics of the package, equivalent performance of wafer scale integration may virtually be achieved due to the fact that interchip communication can take place without the need for drivers and receivers, especially between neighboring chips. Electrical modeling and circuit simulations have shown that with low capacitance lines, the communication speed between chips is virtually unaffected in this package.

While the present invention has been disclosed in connection with the preferred embodiment thereof, it should be understood that there may be other embodiments which fall within the spirit and scope of the invention as defined by the following claims.

What is claimed is:

1. An integrated circuit chip packaging structure comprising:
    a substrate;
    alternating insulation and conductive layers on said substrate; at least two of said conductive layers being patterned conductive layers having substantially coplanar spaced apart power and signal lines on each layer;
    interlayer connections between selected lines of at least two of said patterned conductive layers, and, said signal lines are separated from each other by at least one power line.

2. The packaging structure of claim 1 wherein interlayer connections are made between a plurality of the power lines of a patterned conductive layer and a plurality of the power lines of another patterned conductive layer;
    the particular voltage level of any two interconnected power lines being the same;
    whereby at least one power plane at a particular voltage level exists in three dimensions.

3. The packaging structure of claim 1 wherein interlayer connections are made between a plurality of the power lines of a patterned conductive layer and a plurality of the power lines of another patterned conductive layer;
    the particular voltage level of any two interconnected power lines being the same,
    whereby at least one power plane at a particular voltage level exists in three dimensions.

4. The packaging structure of claim 3 further comprising a personalized conductive reference structure having a substantially planar upper surface;
    said reference structure having insulating regions extending at least partially through the body of said personalized reference structure at predetermined locations;
    said predetermined locations of said insulting regions coinciding with the locations of selected portions of the subsequent overlying patterned conductive layer;
    said reference structure being located above said base substrate and below a pair of patterned conductive layers in said package.

5. The packaging structure of claim 3 wherein said insulation layers are formed of dielectric material selected from the group of organic dielectrics having active hydrogen atoms.

6. The packaging structure of claim 3 wherein interlayer connections between two patterned conductive layers are completed by stepped conductive vias;
    said stepped conductive vias comprising a mound of dielectric material having metallization thereon;
    said metallization electrically interconnecting two patterned conductive layers.

7. The packaging structure of claim 1 further comprising a personalized conductive reference structure having a substantially planar upper surface;
    said reference structure having insulating regions extending at least partially through the body of said personalized reference structure at predetermined locations;
    said predetermined locations of said insulating regions coinciding with the locations of selected portions of the subsequent overlying patterned conductive layer;
    said reference structure being located above said base substrate and below a pair of patterned conductive layers in said package.

8. The packaging structure of claim 7 wherein said insulation layers are formed of dielectric material selected from the group of organic dielectrics having active hydrogen atoms.

9. The packaging structure of claim 7 wherein interlayer connections between two patterned conductive layers are completed by stepped conductive vias;
    said stepped conductive vias comprising a mound of dielectric material having metallization thereon;

said metallization electrically interconnecting two patterned conductive layers.

10. The packaging structure of claim 1 wherein interlayer connections between two patterned conductive layers are completed by stepped conductive vias;
said stepped conductive vias comprising a mound of dielectric material having metallization thereon;
said metallization electrically interconnecting two patterned conductive layers.

11. The packaging structure of claim 10 wherein said insulation layers are formed of dielectric material selected from the group of organic dielectrics having active hydrogen atoms.

12. The packaging structure of claim 1 wherein said insulation layers are formed of dielectric material selected from the group of organic dielectrics having active hydrogen atoms.

13. The packaging structure of claim 1 further comprising a grid of thin film metallization lines that are shorted together at each intersection of thin film lines;
said grid being located above the uppermost patterned conductive layer in said packaging structure.

14. The packaging structure of claim 1 wherein said substrate is made of silicon.

15. The packaging structure of claim 1 wherein said substrate is made of gallium arsenide.

16. The packaging structure of claim 1 wherein said patterned conductive layers are made of thin film metallurgy lines having widths in the range of 2-15 microns.

17. The packaging structure of claim 16 further comprising thin film metallurgy on areas substantially near the perimeter of selected conductive layers;
said perimeter thin film metallurgy being selectively interconnected to other perimeter thin film metallurgy in said package and connected to at least one external power source;
thereby forming power busses in said package.

18. The packaging structure of claim 1 wherein said insulation layers are made of materials selected from the group of organic dielectrics having active hydrogen atoms.

19. The packaging structure of claim 18 wherein said insulation layers are made of polyimide.

20. An integrated circuit chip packaging structure comprising:
a substrate;
alternating insulation and conductive layers on said substrate;
at least two of said conductive layers being patterned conductive layers having substantially parallel, coplanar spaced apart conductive lines thereon;
a personalized conductive reference structure having insulating regions extending at least partially through the body of said personalized reference structure at predetermined locations;
said predetermined locations of said insulating regions coinciding with the locations of selected portions of the subsequent overlying patterned conductive layer;
said reference structure being located above said base substrate and below a pair of patterned conductive layers in said package;
interlayer connections between selected lines of at least two of said patterned conductive layers.

21. The packaging structure of claim 20 wherein said patterned conductive layers are comprised of substantially coplanar power and signal lines.

22. The packaging structure of claim 21 wherein interlayer connections between two patterned conductive layers are completed by stepped conductive vias;
said conductive stepped vias comprising a mound of dielectric material having metallization thereon;
said metallization electrically interconnecting two patterned conductive layers.

23. The packaging structure of claim 21 wherein said insulation layers are formed of dielectric material selected from the group of organic dielectrics having active hydrogen atoms.

24. The packaging structure of claim 20 wherein interlayer connections between two patterned conductive layers are completed by stepped conductive vias;
said conductive stepped vias comprising a mound of dielectric material having metallization thereon;
said metallization electrically interconnecting two patterned conductive layers.

25. The packaging structure of claim 24 wherein said insulation layers are formed of dielectric material selected from the group of organic dielectrics having active hydrogen atoms.

26. The packaging structure of claim 24 further comprising a grid of thin film metallization lines that are shorted together at substantially all intersections of thin film lines;
said grid being located above the uppermost patterned conductive layer in said packaging structure.

27. The packaging structure of claim 20 wherein said insulation layers are formed of dielectric material selected from the group of organic dielectrics having active hydrogen atoms.

28. the package structure of claim 27 further comprising a grid of thin film metallization lines that are shorted together at substantially all intersections of thin film lines;
said grid being located above the uppermost patterned conductive layer in said packaging structure.

29. The packaging structure of claim 20 further comprising a grid of thin film metallization lines that are shorted together at substantially all intersections of thin film lines;
said grid being located above the uppermost patterned conductive layer in said packaging structure.

30. The packaging structure of claim 21 further comprising a grid of thin film metallization lines that are shorted together at substantially all intersections of thin film lines;
said grid being located above the uppermost patterned conductive layer in said packaging structure.

31. A packaging structure comprising:
a substrate;
alternating insulation and conductive layers on said substrate, the uppermost layer being a conductive layer;
said insulation layers being formed of material selected from the group of organic dielectrics having active hydrogen atoms;
at least two of said conductive layers being patterned conductive layers having substantially coplanar spaced apart power and signal lines on each layer;
said power lines of each patterned conductive layer being substantially parallel to said signal lines on the same layer;

each of said substantially coplanar signal lines being separated from each other by at least one substantially coplanar power line;

stepped conductive vias comprising a dielectric mound having metallization thereon;

said metallization electrically interconnecting selected portions of said patterned conductive layers;

a personalized conductive reference structure having insulating regions extending at least partially through the body of said personalized reference structure at predetermined locations;

said predetermined locations of said insulating regions coinciding with the locations of selected portions of the subsequent overlying patterned conductive layer;

said reference structure being located above said substrate and below a pair of patterned conductive layers in said package.

32. The packaging structure of claim 31 further comprising a grid of thin film metallization lines that are shorted together at each intersection of thin film lines;

said grid being located above the uppermost pair of patterned conductive layers in said packaging structure.

33. The packaging structure of claim 32 wherein at least portions of the surface of said insulation layers are silylated.

34. The packaging structure of claim 31 wherein said patterned conductive layers are made of thin film metallurgy lines having widths in the range of 2-15 microns.

35. The packaging structure of claim 34 further comprising strips of thin film metallurgy on selected areas of the perimeter of selected patterned conductive layers;

said strips being selectively interconnected to other strips in said package and connected to at least one external power source;

thereby forming power busses in said package.

36. An integrated circuit chip packaging structure comprising:

a substrate;

alternating insulation and conductive layers on said substrate;

at least two of said conductive layers being patterned conductive layers having substantially parallel, coplanar, spaced apart conductive lines thereon;

said patterned conductive layers being interconnected by stepped conductive vias;

said vias comprising a mound of dielectric material having metallization thereon, said metallization interconnecting two patterned conductive layers.

37. An integrated circuit chip packaging structure comprising:

a substrate;

alternating insulation and conductive layers on said substrate;

at least two of said conductive layers being patterned conductive layers having substantially parallel, coplanar, spaced apart conductive lines thereon;

at least one of said insulation layers being formed of dielectric material selected from the group of organic dielectrics having active hydrogen atoms.

* * * * *